United States Patent
Lin et al.

(10) Patent No.: US 11,063,137 B2
(45) Date of Patent: Jul. 13, 2021

(54) ASYMMETRIC SPACER FOR LOW CAPACITANCE APPLICATIONS

(71) Applicant: Intel Corporation, Santa Clara, CA (US)

(72) Inventors: Jui-Yen Lin, Hillsboro, OR (US); Chen-Guan Lee, Hillsboro, OR (US); Joodong Park, Portland, OR (US); Walid M. Hafez, Portland, OR (US); Kun-Huan Shih, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 16/302,698

(22) PCT Filed: Jun. 28, 2016

(86) PCT No.: PCT/US2016/039749
§ 371 (c)(1),
(2) Date: Nov. 19, 2018

(87) PCT Pub. No.: WO2018/004528
PCT Pub. Date: Jan. 4, 2018

(65) Prior Publication Data
US 2019/0123170 A1    Apr. 25, 2019

(51) Int. Cl.
| | |
|---|---|
| *H01L 29/78* | (2006.01) |
| *H01L 29/66* | (2006.01) |
| *H01L 21/8234* | (2006.01) |
| *H01L 27/088* | (2006.01) |
| *H01L 21/28* | (2006.01) |
| *H01L 21/265* | (2006.01) |

(52) U.S. Cl.
CPC .. *H01L 29/66659* (2013.01); *H01L 21/26586* (2013.01); *H01L 21/2815* (2013.01); *H01L 21/823425* (2013.01); *H01L 21/823468* (2013.01); *H01L 27/088* (2013.01); *H01L 29/66* (2013.01); *H01L 29/6656* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 6,265,256 B1 | 7/2001 | An et al. | |
| 9,184,294 B2 | 11/2015 | Cea et al. | |
| 9,812,460 B1 * | 11/2017 | Wu | H01L 27/11546 |

(Continued)

OTHER PUBLICATIONS

The International Searching Authority, International Search Report and Written Opinion of the International Searching Authority dated Mar. 28, 2017 in International Application No. PCT/US2016/039749, nine pages.

(Continued)

*Primary Examiner* — Ali Naraghi
(74) *Attorney, Agent, or Firm* — Trop, Pruner & Hu, P.C

(57) ABSTRACT

An embodiment includes an apparatus comprising: a transistor including a source, a drain, and a gate that has first and second sidewalls; a first spacer on the first sidewall between the drain and the gate; a second spacer on the second sidewall between the source and the gate; and a third spacer on the first spacer. Other embodiments are described herein.

18 Claims, 8 Drawing Sheets

(56) References Cited

U.S. PATENT DOCUMENTS

| | | | |
|---|---|---|---|
| 2006/0194381 A1* | 8/2006 | Wei | H01L 29/7835 438/197 |
| 2011/0227160 A1* | 9/2011 | Liang | H01L 21/823468 257/356 |
| 2014/0262039 A1 | 9/2014 | Cheng et al. | |
| 2015/0187660 A1 | 7/2015 | Patzer et al. | |
| 2016/0149013 A1 | 5/2016 | Chou et al. | |
| 2019/0393234 A1* | 12/2019 | Lin | H01L 21/76802 |

OTHER PUBLICATIONS

Wikipedia, "Cascode", May 28, 2016, seven pages, https://en.wikipedia.org/wiki/Cascode.

Taiwanese Patent Office, Office Action and Search Report dated Aug. 5, 2020 in Taiwanese patent application No. 106116139, 8 pages total.

* cited by examiner

ASYMMETRIC SPACER FOR LOW CAPACITANCE APPLICATIONS

TECHNICAL FIELD

Embodiments of the invention relate to transistors with relatively low gate-drain overlap capacitance.

BACKGROUND

In a common source amplifier, the Miller effect causes gate-drain overlap capacitance (CGD) to be multiplied by the gain, resulting in a significant resistive-capacitive (RC) penalty and lower circuit speed.

One conventional technique to combat the Miller effect is to employ a cascode circuit topology (see FIG. 1). The cascode is a two-stage amplifier comprising a common emitter stage feeding into a common base stage. Compared to a single amplifier stage, this combination may have one or more of the following characteristics: higher input-output isolation, higher input impedance, high output impedance, higher gain, or higher bandwidth. Cascode 100 is constructed from two transistors (e.g., BJTs or FETs) 101, 102, with one operating as a common emitter or common source and the other as a common base or common gate. The cascode improves input-output isolation (or reverse transmission) as there is no direct coupling from the output to input. This eliminates or reduces the Miller effect and thus contributes to a much higher bandwidth.

Another conventional technique to combat the Miller effect and reduce overlap capacitance is shown in FIG. 2. System 200 includes spacers 201, 202, 203, 204, 205, 206, which are thickened uniformly about gates 207, 208, 209 relative to normal spacer thicknesses.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
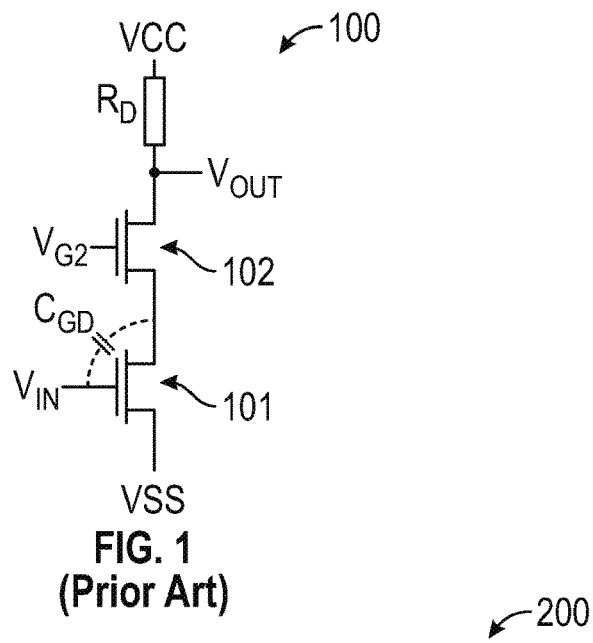
FIG. 1 includes a conventional cascode configuration.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer or etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As referenced above, a cascode configuration can help combat the Miller effect. However, Applicant has determined a cascode configuration needs additional area (e.g., the additional transistor 102 of FIG. 1 plus biasing circuitry for VG2). Applicant has further determined the additional transistor also consumes voltage headroom, so a higher VCC is typically needed. Area and power are sacrificed for this kind of approach.

As further referenced above, thickened spacers on opposing sides of gates can help combat Miller effect. However, Applicant has determined this often reduces the drive current of the transistor due to the reduced gate-source overlap. Also, the gate cross-sectional area is reduced which increases the gate resistance and therefore incurs an RC penalty.

In other words, one of the major factors which determines the speed and bandwidth of a circuit or amplifier is the transistor gate-drain overlap capacitance. Although circuit techniques are available to mitigate this effect (see FIGS. 1 and 2), they typically consume area and/or power and may result in a RC penalty.

However, an embodiment includes a transistor with an asymmetric gate spacer where the gate-drain overlap capacitance is reduced. More specifically, an embodiment includes depositing a second spacer on a first spacer and inside a gate area of a transistor, and then selectively retaining the second spacer on the drain side but removing it on the source side. The resulting asymmetric spacer transistor has a significantly reduced gate-drain overlap capacitance, which can result in faster circuit performance.

Such an embodiment has advantages over the conventional technique of FIG. 1 since it does not need to trade off larger area and higher power for better performance. Such an embodiment has advantages over the conventional technique of FIG. 2 since the asymmetric spacer maintains the gate-source overlap but does not consume as much gate area due to its drain versus source asymmetry.

Figure 3:
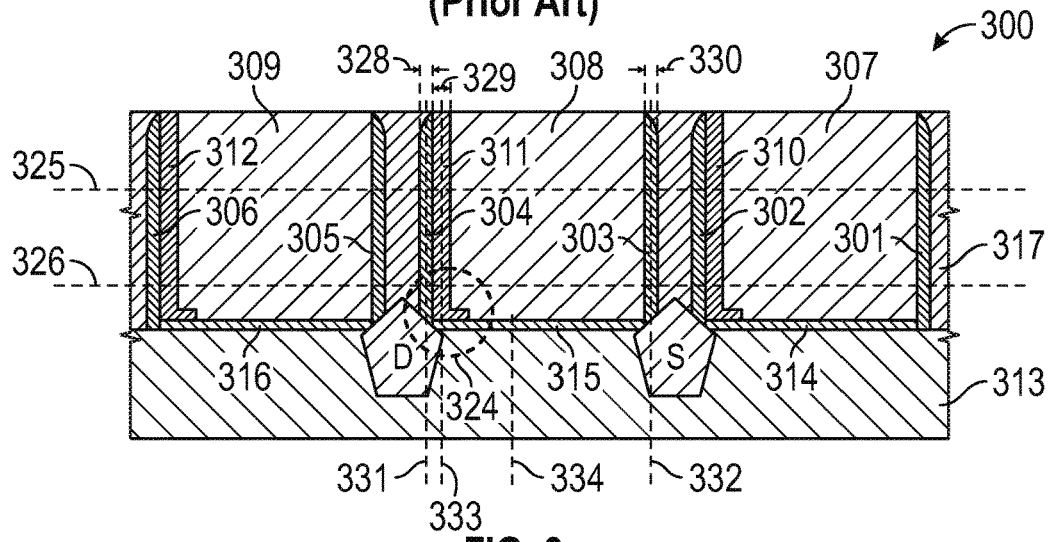
FIG. 3 includes an embodiment of an asymmetric spacer in an embodiment concerning a planar transistor.

FIG. 3 includes an embodiment of an asymmetric spacer wherein the drain (D) side of the transistor having gate 308 has an additional spacer 311. The problematic gate-drain overlap capacitance CGD between gate 308 and drain D can therefore be significantly reduced. The source (S) side of the transistor having gate 308 can still have a thin spacer 303 for high performance and gate resistance benefits. Apparatus 300 is formed using a complementary metal oxide semiconductor (CMOS) compatible process.

More specifically, FIG. 3 provides S and D nodes for a planar transistor with a channel formed in substrate 313. Gates 307, 308, 309 are formed on gate dielectric portions 314, 315, 316 and within dielectric 317. Such gates are adjacent symmetric primary spacers 301, 302, 303, 304, 305, 306 as well as asymmetric spacers 310, 311, 312. In an embodiment, gates 307, 309 may be removed later in the process or left unconnected (no contact formed to gate to make gate operable).

Figure 6:
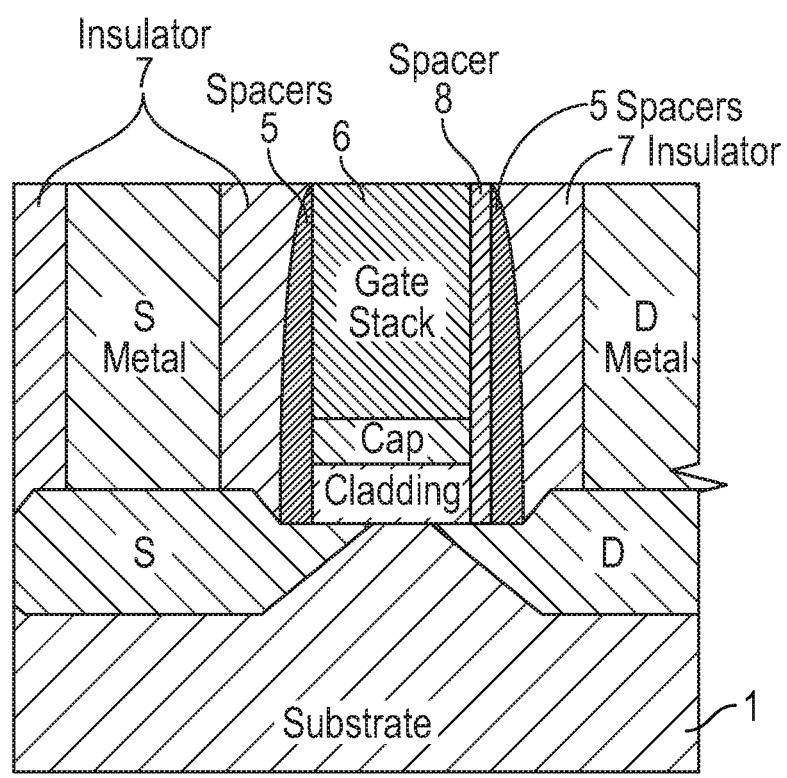
FIG. 6 includes an embodiment of an asymmetric spacer in an embodiment concerning a nonplanar transistor.

While the above embodiment describes a planar transistor, other embodiments may include nonplanar transistors, such as FinFETs. A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin). FIG. 6 includes an embodiment for a FinFET. FIG. 6 includes substrate fin 1 with S and D regions, S and D metal contacts, insulation 7, gate stack 6, primary spacers 5, and additional asymmetric spacer 8. Other cap and cladding layers are included but are optional and not discussed to maintain focus on the asymmetric spacer.

FIGS. 4(a)-(g) describe a process in an embodiment. The process is based on a remove metal gate (RMG) process. Before addressing the process embodiment, the RMG process is briefly addressed.

U.S. Pat. No. 9,184,294, assigned to Intel Corp., Santa Clara, Calif., U.S.A., addresses a process for forming a gate stack using an RMG process. In general, once fins are formed, a sacrificial gate material can be deposited on fins (which are cladded in embodiments described in the above mentioned patent but need not necessarily be cladded to still be considered a RMG process). In some cases, a sacrificial gate dielectric material may be deposited on the fins, and then the sacrificial gate material is deposited on the sacrificial gate dielectric material. An RMG process does not necessarily have to work with nonplanar transistors (e.g., Fin-FETs) as described in the above mentioned patent and may instead work with planar transistors. Regardless of whether the transistor is planar or nonplanar, the deposited sacrificial gate material can then be planarized to remove any undesired topology and/or excess sacrificial gate material. A hard mask can then be provisioned and patterned on the sacrificial gate material layer, as typically done, followed by an etch process that results in the formation of sacrificial gate stacks.

Patterning of the sacrificial gate material can be carried out, for example, from a single depth of focus due to pre-patterning planarization of the sacrificial material layer, and using standard photolithography including deposition of hard mask materials (e.g., such as SiO2, SiN, and/or other suitable hard mask materials) on the sacrificial gate material, patterning resist on a portion of the hard mask that will remain temporarily to protect the underlying gate region of the device, etching to remove the unmasked (no resist) portions of the hard mask (e.g., using a dry etch, or other suitable hard mask removal process), and then stripping the patterned resist, thereby leaving the patterned gate mask. The hard mask may be implemented with SiN (e.g., 100 Å to 500 Å thick) but any number of suitable hard mask configurations can be used.

Once the gate pattern hard mask is complete, etching can be carried out to remove the non-masked sacrificial gate material (and any remaining dummy gate dielectric material and/or pad oxide) down to the substrate and slightly into the substrate to form the source/drain regions, in accordance with some example embodiments. The etching can be accomplished with standard photolithography and may include, for example, dry etching or any suitable etch process or combination of etches. Note that the source/drain regions may be formed using the gate structure as a mask. In some embodiments, ion implantation may be used to dope the source/drain regions as conventionally done. The geometry of the resulting gate structure (e.g., width, depth, shape) as well as the shape and depth of source/drain regions, can vary from one embodiment to the next.

This gate patterning can be used to simultaneously produce a plurality of such structures where, for example, all the transistors to be formed will be the same, or some transistors are one type/configuration (e.g., PMOS) and the remainder are another type/configuration (e.g., NMOS). The deposition of gate stack materials can be carried out, for example, using CVD or other suitable process. In an example the substrate is a bulk silicon substrate, the recessed STI material is SiO2, the fins are silicon (formed in the substrate), the cladding is SiGe, and the sacrificial gate material is polysilicon. The sacrificial gate material can be any suitable sacrificial material (e.g., polysilicon, silicon nitride, silicon carbide, etc.). In devices that include a sacrificial gate dielectric material, the sacrificial gate dielectric material can be, for instance, SiO2 or any other suitable dummy gate insulator material.

Once the sacrificial gate stacks are formed, an RMG process and transistor formation can take place. Specifically, the sacrificial gates ("dummy gates") are removed leaving forms for eventual active gate material. There are many variations to an RMG process and those of ordinary skill in the art will appreciate that FIG. 4(a) shows a process step whereby the dummy gates have been removed (and that there are many variations of RMG processes that could have led to the stage shown in FIG. 4(a)).

Figure 4A:
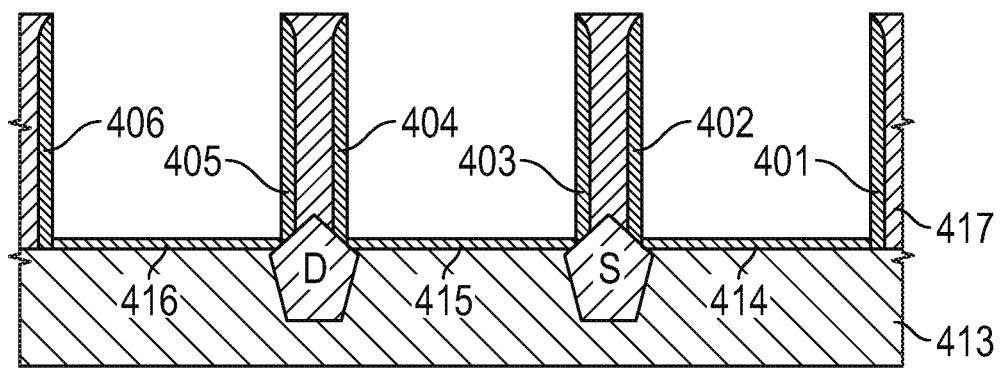
FIGS. 4(a)-(g) include a process in an embodiment.

The embodiment of FIG. 4(a) provides S and D nodes (or at least locations for potential S and D nodes) for a planar transistor with a channel formed in substrate 413, gate dielectric portions 414, 415, 416, and dielectric 417. Symmetric primary spacers 401, 402, 403, 404, 405, 406 are present.

Figure 4B:
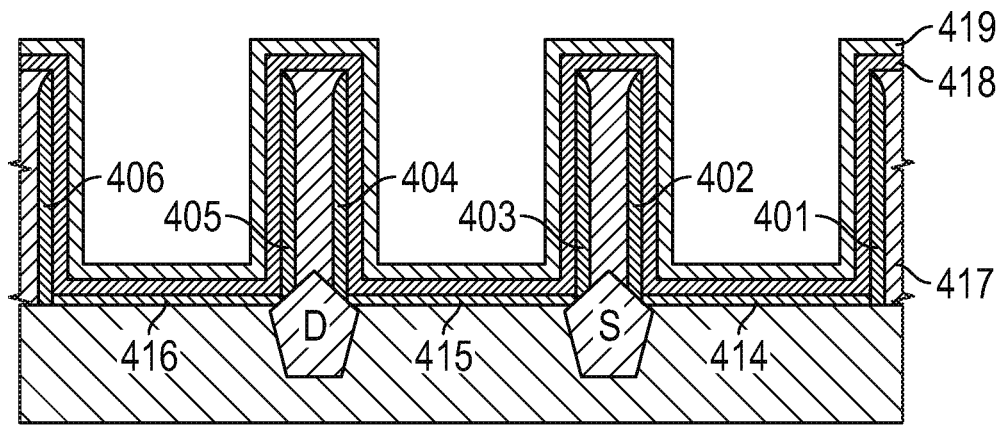
Figure 4C:
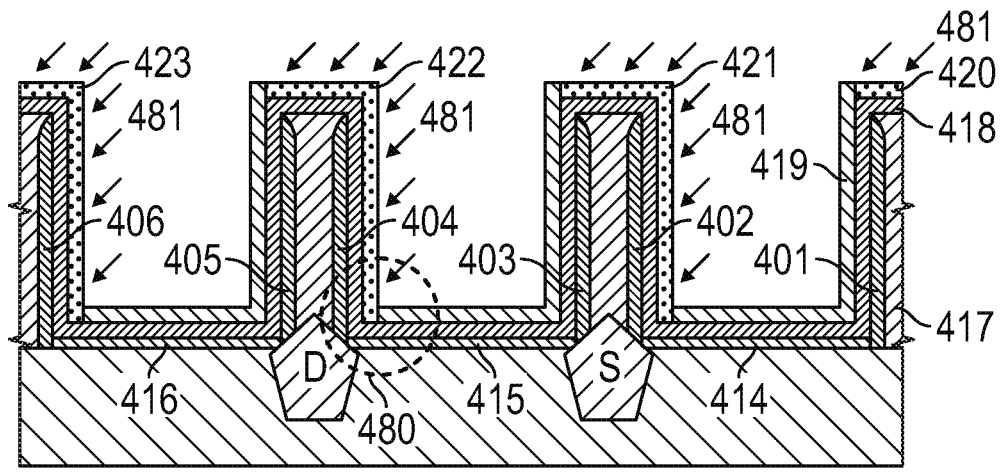
Figure 4D:
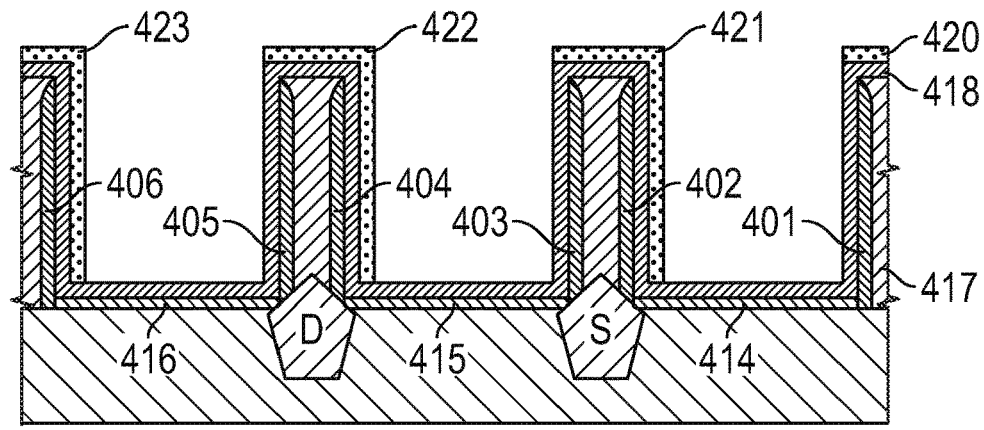

In FIG. 4(b) additional spacer layer 418 is deposited followed by a thin Si hard mask layer 419. In FIG. 4(c) an angled implant 481 is used to selectively harden the Si on the drain side of the gate (see hardened Si portions 420, 421, 422, 423. A subsequent clean removes the unhardened Si to yield the stage of FIG. 4(d). Doing so exposes the source side 485 of the vacated gate location 486 to a spacer removal process while the drain side spacer 487 is still protected (FIG. 4(e)). Finally the Si hard mask is removed (FIG. 4(f)), resulting in the drain sides having additional spacer portions 402', 404', 406', and normal processing can continue to form active gates 407, 408, 409 (FIG. 4(g)) (or possibly only having gate 408 later become active).

Figure 5:
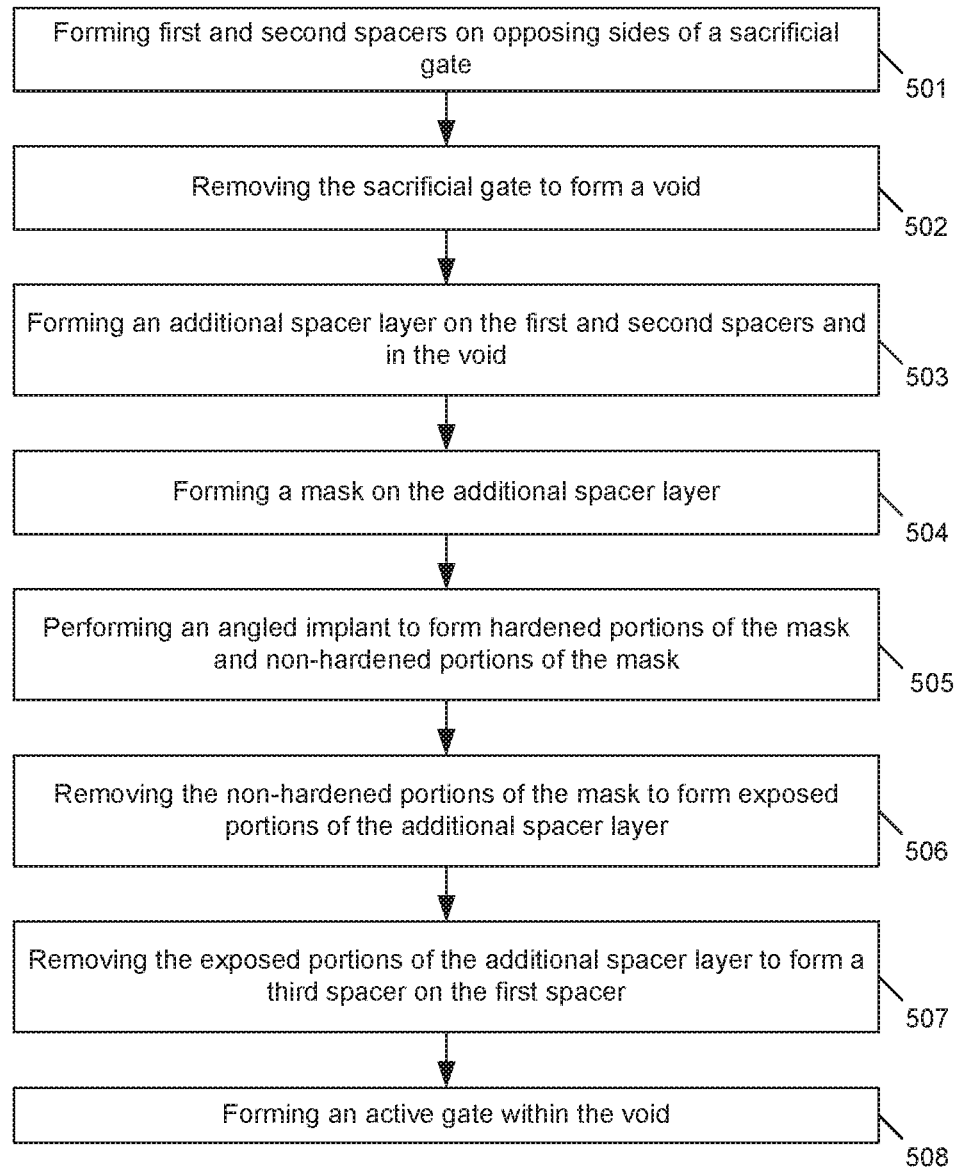
FIG. 5 includes a process in an embodiment.

FIG. 5 includes a process in an embodiment. Block 501 includes forming first and second spacers on opposing sides of a sacrificial gate. Block 502 includes removing the sacrificial gate to form a void. Block 503 includes forming an additional spacer layer on the first and second spacers and in the void. Block 504 includes forming a mask on the additional spacer layer. Block 505 includes performing an angled implant to form hardened portions of the mask and non-hardened portions of the mask. Block 506 includes removing the non-hardened portions of the mask to form exposed portions of the additional spacer layer. Block 507 includes removing the exposed portions of the additional spacer layer to form a third spacer on the first spacer. Block 508 includes forming an active gate within the void.

Figure 7:
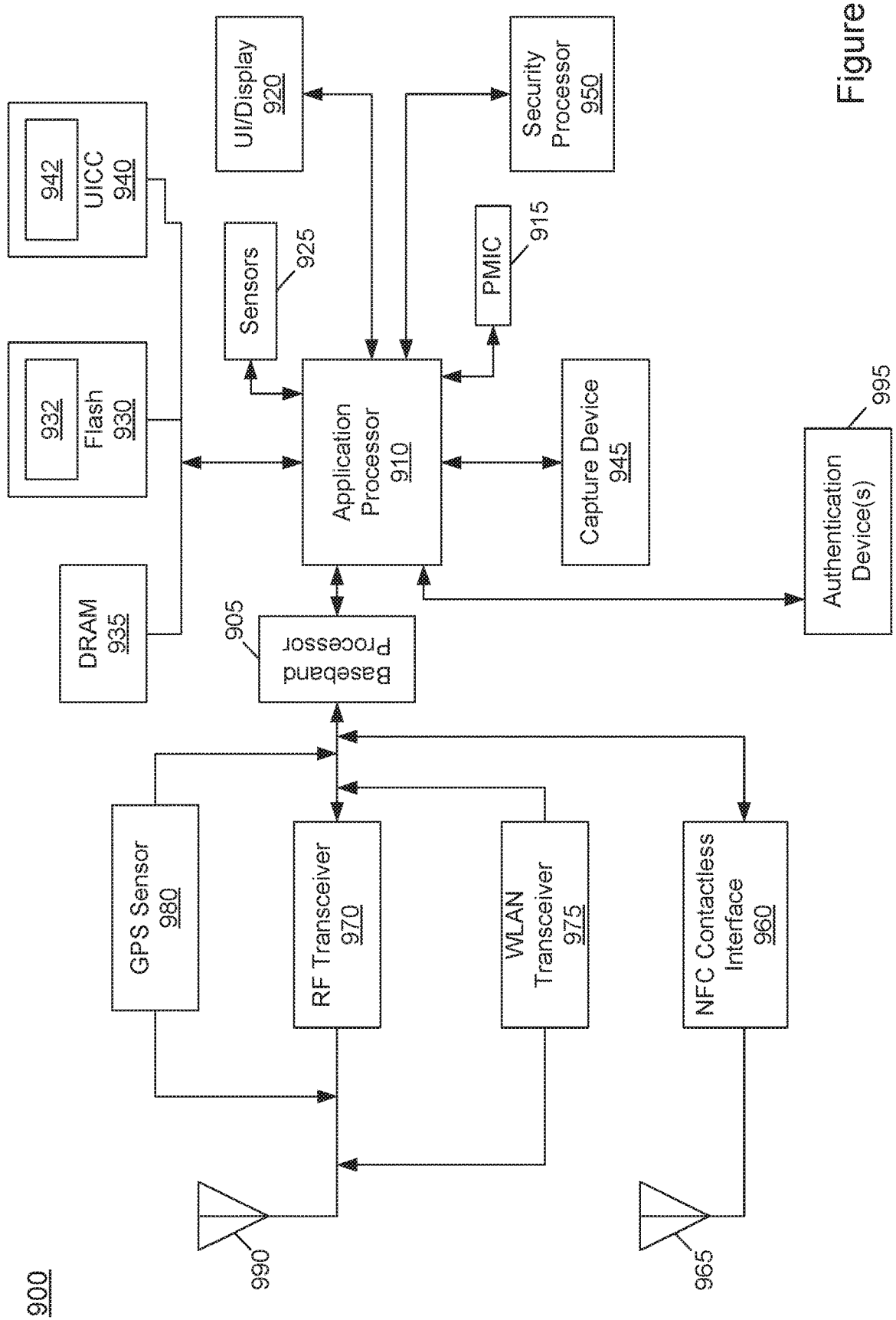
FIGS. 7, 8, 9 include systems that include embodiments.

Referring now to FIG. 7, shown is a block diagram of an example system with which embodiments can be used. As seen, system 900 may be a smartphone or other wireless communicator or any other Internet of Things (IoT) device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. Transceiver 970, or other components of FIG. 7, may include an amplifier that requires strong RC performance and lowered gate-drain capacitance and therefore may use an embodiment described herein. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 8:
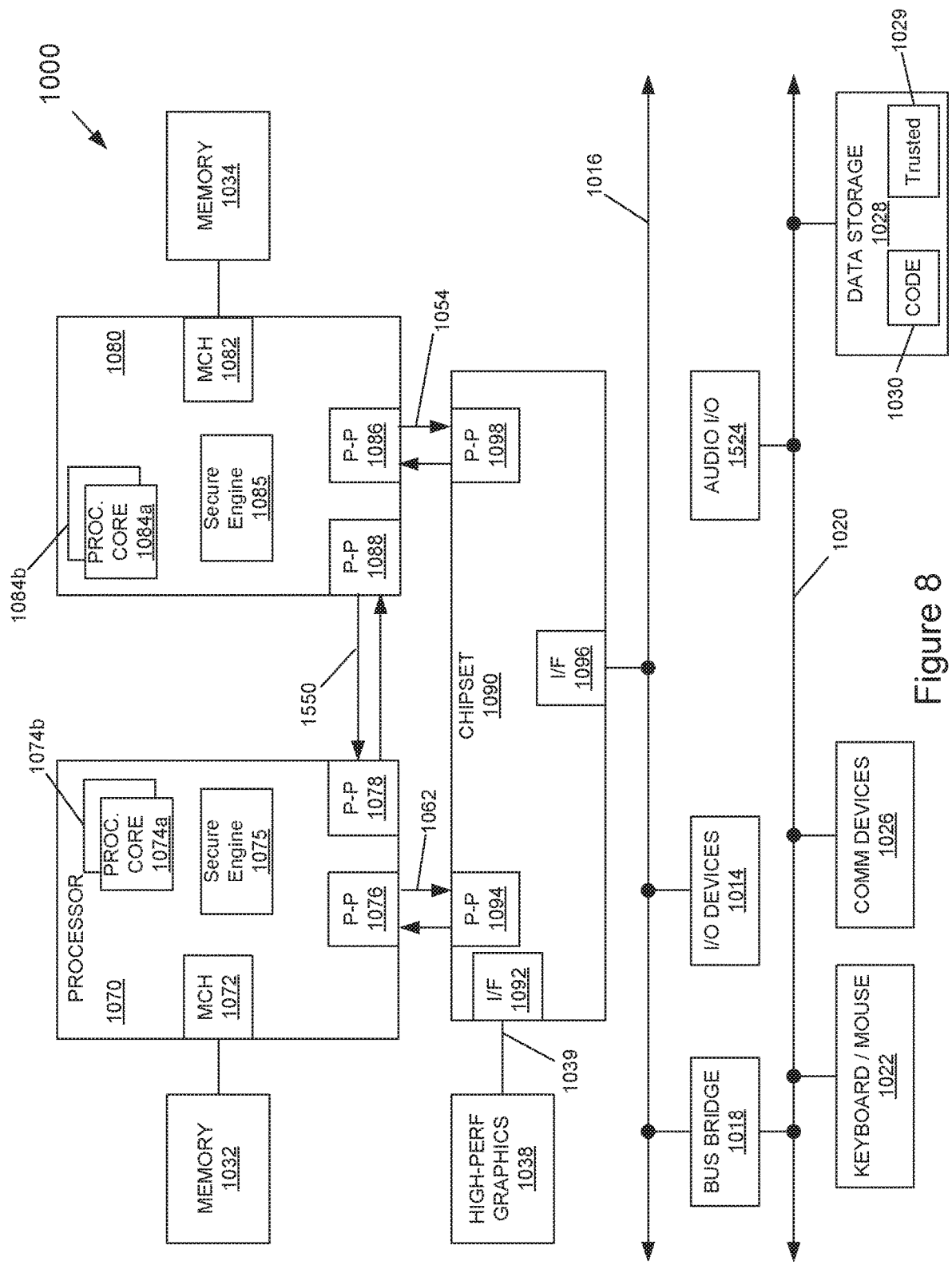

Referring now to FIG. 8, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 9:
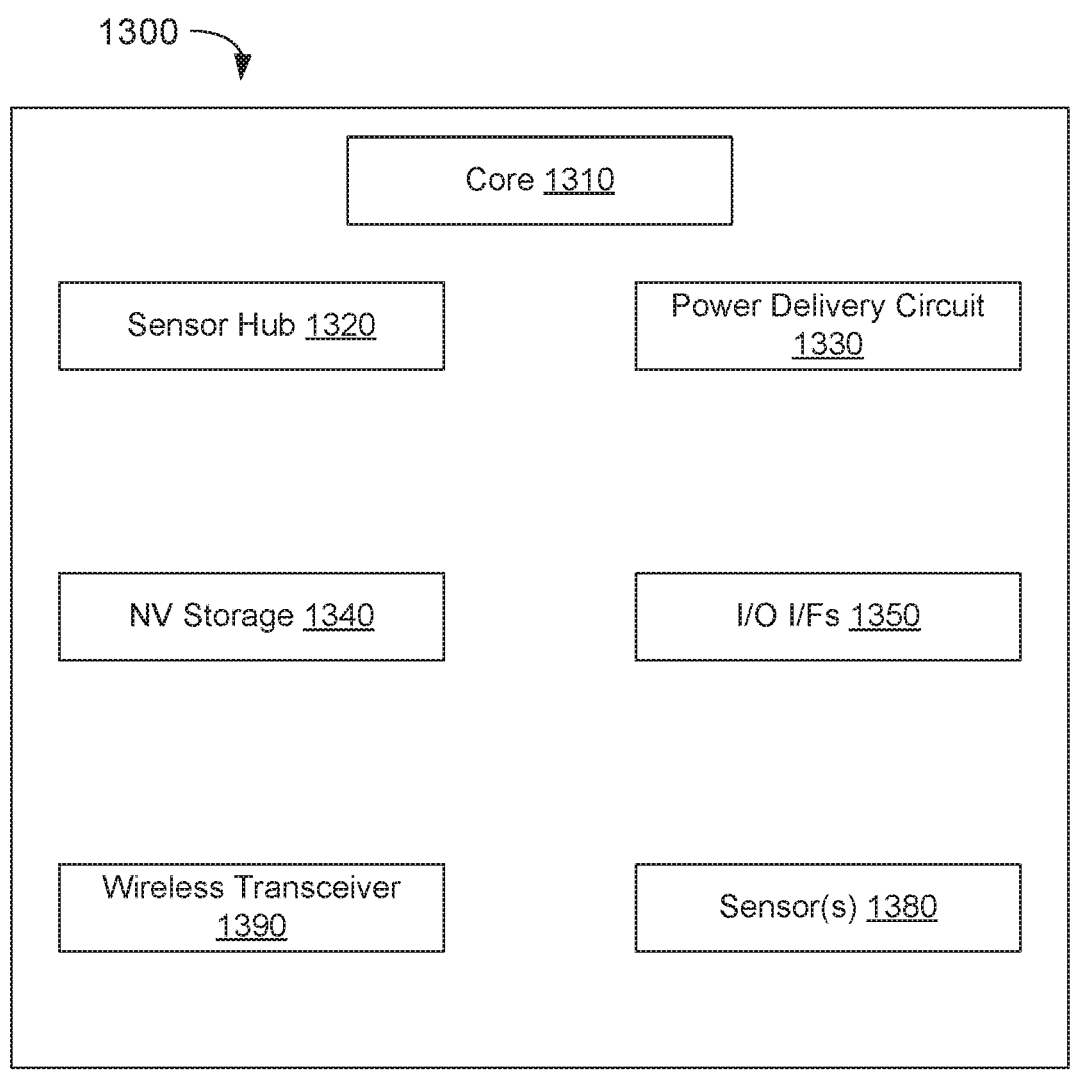

Embodiments may be used in environments where IoT devices may include wearable devices or other small form factor IoT devices. Referring now to FIG. 9, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Transceiver 970, or other components of FIG. 9, may include an amplifier that requires strong RC performance and lowered gate-drain capacitance and therefore may use an embodiment described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1 includes an apparatus comprising: a transistor including a source, a drain, and a gate that has first and second sidewalls; a first spacer on the first sidewall between the drain and the gate; a second spacer on the second sidewall between the source and the gate; and a third spacer on the first spacer.

For example, in the embodiment of FIG. 3 gate 308 includes a sidewall upon which spacer 304 is formed, another sidewall upon which spacer 303 is formed, and spacer 311 is formed on spacer 304.

Example 2 includes the apparatus of example 1 wherein a horizontal axis intersects the gate and the first, second, and third spacers.

For instance, see axis 325.

Example 3 includes the apparatus of example 2 wherein the first, second, and third spacers are not monolithic with each other.

Example 4 includes the apparatus of example 3 wherein the first spacer includes a first spacer material and the third spacer includes a third spacer material that is not the same as the first spacer material.

For instance, spacer 304 may include a nitride (e.g., SiN) and spacer 311 may include an oxide (e.g., SiO2).

Example 5 includes the apparatus of example 4 wherein the first spacer material includes one of an oxide and a nitride and the third spacer includes another of the oxide and the nitride.

Example 6 includes the apparatus of example 5 wherein the second spacer includes a second spacer material that is the same as the first spacer material.

For example, in the embodiment of FIG. 3 both of spacers 303, 304 may include a nitride or an oxide. For instance, one may include SiO2 while another includes a doped form of SiO2 or one may include materials $A_{1-x}B_x$ while another includes $A_{1-y}B_y$ where x is unequal to y. Thus, a material may be the "same" as another material if it includes the same chemical elements, even though one may have additional chemical elements or the same chemical elements albeit in different ratios to one another.

Example 7 includes the apparatus of example 6, wherein the third spacer is between the first spacer and the gate.

Example 8 includes the apparatus of example 3 comprising a substrate upon which the transistor is formed, wherein the first spacer extends further down the first sidewall towards the substrate than does the third spacer.

Figure 4E:
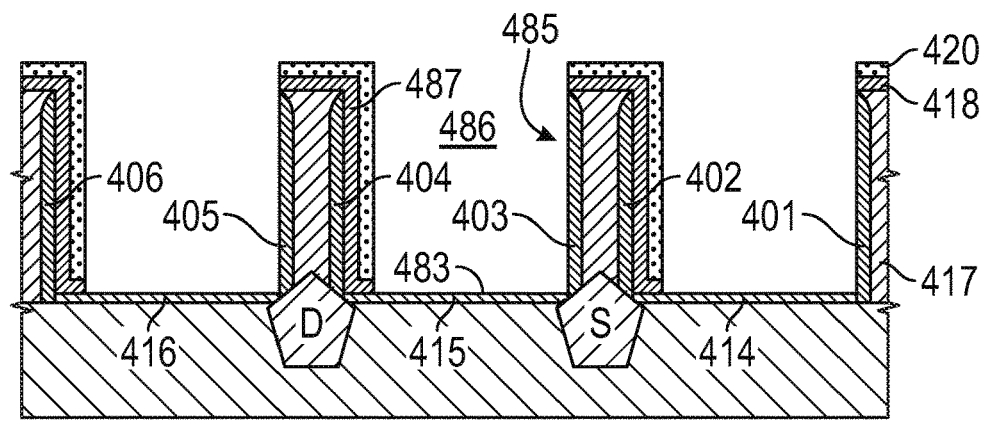
Figure 4F:
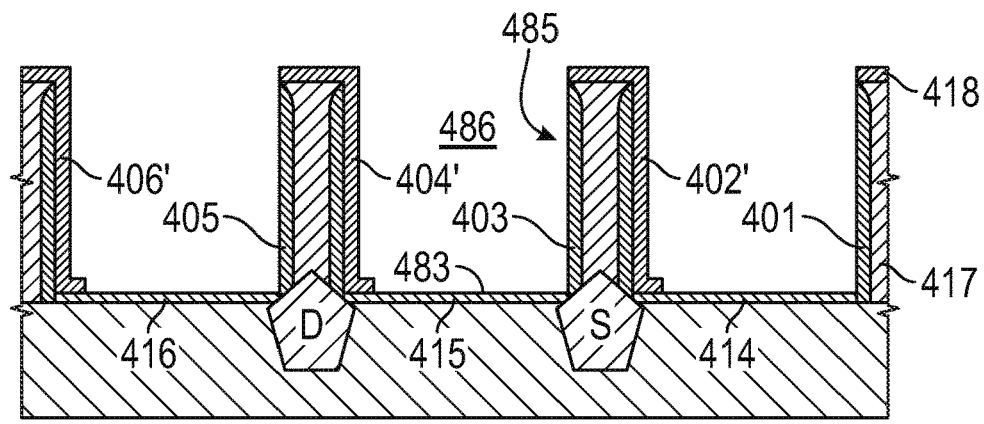
Figure 4G:
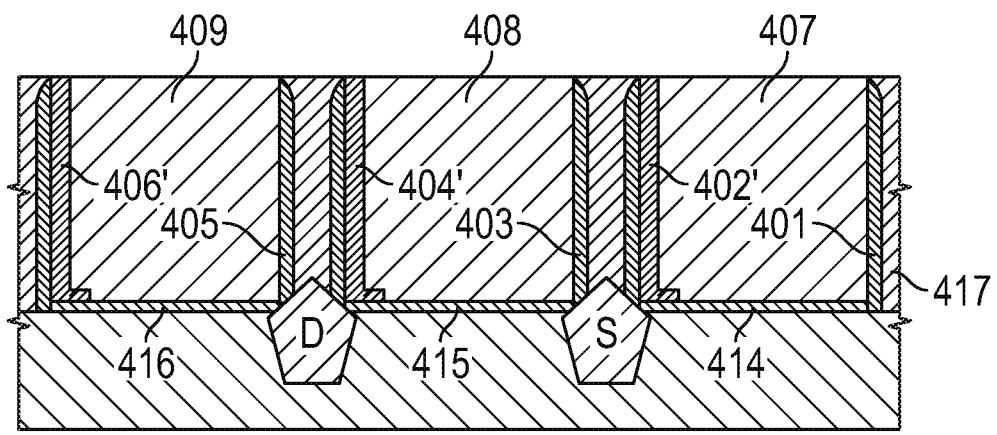

For example, in the embodiment of FIG. 4(c), due to the angle implant 481 area 480 may not be hardened and therefore may be exposed in FIG. 4(e) such that the asymmetric spacer 487 does not go all the way to the floor 483 of void 486.

Example 9 includes the apparatus of example 8 wherein an additional horizontal axis, located below the horizontal axis, intersects the gate and the first and second spacers but not the third spacer.

This may be due to the angled implant discussed immediately above. See axis 326 of the embodiment of FIG. 3.

Example 10 includes the apparatus of example 3 comprising a system on a chip (SOC) including an amplifier that includes the transistor.

Figure 2:
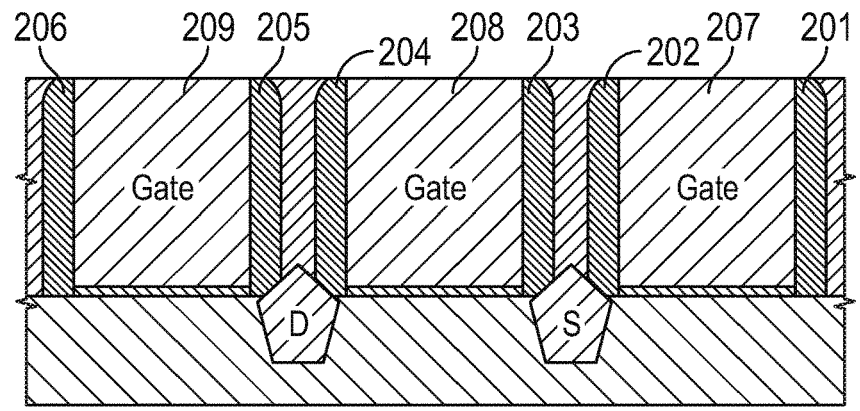
FIG. 2 includes a conventional thickened spacer arrangement.

Such a chip may be used in radio-frequency applications (RF) that typically rely on systems such as FIGS. 1 and 2 to control gate-drain capacitance.

Example 11 includes the apparatus of example 10, wherein the transistor is not included in a cascode configuration.

Example 12 includes the apparatus of example 3, wherein the third spacer directly contacts the first spacer.

Example 13 includes the apparatus of example 3 comprising a substrate upon which the transistor is formed, wherein the first spacer has a first maximum width taken parallel to a long axis of the substrate, the second spacer has a second maximum width, the third spacer has a third maximum width, the first and third maximum widths are substantially equal, and the first and second maximum widths are unequal.

For example, in the embodiment of FIG. 3 see width 328 for the first spacer, width 329 for the third spacer, and width 330 for the second spacer.

Example 14 includes the apparatus of example 3 wherein there is no additional spacer on the second spacer.

Example 15 includes the apparatus of example 3, wherein the first, second, and third spacers collectively form asymmetric spacers about the gate such that a total width of spacers on the first sidewall is unequal to a total width of spacers on the second sidewall.

Example 16 includes the apparatus of example 3, wherein a first vertical axis intersects the first spacer but not the second or third spacers, a second vertical axis intersects the second spacer but not the first or third spacers, a third vertical axis intersects the third spacer but not the second or first spacers, and a fourth vertical axis intersects the gate but not the first, second, or third spacers.

For example, in the embodiment of FIG. 3 see axis 331 for the first spacer, axis 333 for the third spacer, axis 332 for the second spacer, and axis 334 for gate 308.

Example 17 includes a method comprising: forming first and second spacers on opposing sides of a sacrificial gate; removing the sacrificial gate to form a void; forming an additional spacer layer on the first and second spacers and in the void; forming a mask on the additional spacer layer; performing an angled implant to form hardened portions of the mask and non-hardened portions of the mask; removing the non-hardened portions of the mask to form exposed portions of the additional spacer layer; removing the exposed portions of the additional spacer layer to form a third spacer on the first spacer; and forming an active gate within the void.

Example 18 includes the method of example 17, wherein removing the exposed portions of the additional spacer layer includes removing a first exposed portion of the additional spacer layer, the first exposed portion being on a first side of the void and the third spacer being on a second side of the void that is opposite the first side.

Example 19 includes the method of example 18, wherein the first, second, and third spacers are not monolithic with each other.

Example 20 includes the method of example 19 comprising removing the exposed portions of the additional spacer layer with an etch chemistry specific to a material included in the additional spacer layer and not specific to another material included in the first spacer.

For example, the additional spacer layer may include a nitride while the first spacer may include an oxide. The etchant used for the additional spacer layer may be specific to the nitride but not specific to the oxide.

As another example, an area of the asymmetric spacer (e.g., area 324 of FIG. 3) may include an "L" portion that is both beside and under the gate. This may be due to protection afforded by mask 419 in FIG. 4(e).

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
    a transistor including a source, a drain, and a gate that has first and second sidewalls;
    a first spacer on the first sidewall between the drain and the gate;
    a second spacer on the second sidewall between the source and the gate; and
    a third spacer on the first spacer;
    wherein: (a) a first vertical axis intersects the first spacer but not the second or third spacers, (b) a second vertical axis intersects the second spacer but not the first or third spacers, (c) a third vertical axis intersects the third spacer and the gate but not the second or first spacers, and (d) a fourth vertical axis intersects the gate but not the first, second, or third spacers.

2. The apparatus of claim 1 wherein a horizontal axis intersects the gate and the first, second, and third spacers.

3. The apparatus of claim 2 wherein the first, second, and third spacers are not monolithic with each other.

4. The apparatus of claim 3 wherein the first spacer includes a first spacer material and the third spacer includes a third spacer material that is not the same as the first spacer material.

5. The apparatus of claim 4 wherein the first spacer material includes one of an oxide and a nitride and the third spacer includes another of the oxide or the nitride.

6. The apparatus of claim 5 wherein the second spacer includes a second spacer material that is the same as the first spacer material.

7. The apparatus of claim 6, wherein the third spacer is between the first spacer and the gate.

8. The apparatus of claim 3 comprising:
    a substrate upon which the transistor is formed;
    a gate dielectric corresponding to the gate;
    wherein:
        the first spacer extends further down the first sidewall towards the substrate than does the third spacer;
        the third spacer does not extend down the first sidewall all the way down to the gate dielectric.

9. The apparatus of claim 8 wherein:
    an additional horizontal axis, located below the horizontal axis, intersects at least one of the gate or the gas dielectric;
    the additional horizontal axis intersects the first and second spacers; and
    the additional horizontal axis does not intersect the third spacer.

10. The apparatus of claim 3 comprising a system on a chip (SOC) including an amplifier that includes the transistor.

11. The apparatus of claim 10, wherein the transistor is not included in a cascode configuration.

12. The apparatus of claim 3, wherein the third spacer directly contacts the first spacer.

13. The apparatus of claim 3 comprising a substrate upon which the transistor is formed, wherein the first spacer has a first maximum width taken parallel to a long axis of the substrate, the second spacer has a second maximum width, the third spacer has a third maximum width, the first and third maximum widths are substantially equal, and the first and second maximum widths are unequal.

14. The apparatus of claim 3 comprising contacts corresponding to the source and the drain, wherein there is no additional spacer directly contacting the second spacer.

15. The apparatus of claim 3, wherein the first, second, and third spacers collectively form asymmetric spacers about the gate such that a total width of spacers on the first sidewall is unequal to a total width of the second spacer and any additional spacer on the second sidewall.

16. The apparatus of claim 1 comprising a gate dielectric, wherein:
    the third axis intersects the gate dielectric;
    the third spacer is between the gate and the gate dielectric.

17. An apparatus comprising:
    a transistor including a source, a drain, and a gate that has first and second sidewalls;
    a first spacer on the first sidewall between the drain and the gate;

a second spacer on the second sidewall between the source and the gate;

a third spacer on the first spacer; and a substrate upon which the transistor is formed;

wherein the first spacer has a first maximum width taken parallel to a long axis of the substrate, the second spacer has a second maximum width, the third spacer has a third maximum width, and the first and second maximum widths are substantially equal;

wherein: (a) a first vertical axis intersects the first spacer but does not intersect the second spacer and does not intersect the third spacer, (b) a second vertical axis intersects the second spacer but does not intersect the first spacer and does not intersect the third spacer, (c) a third vertical axis intersects the third spacer and the gate but does not intersect the second spacer and does not intersect the first spacer, and (d) a fourth vertical axis intersects the gate but does not intersect the first spacer, does not intersect the second spacer, and does not intersect the third spacer.

18. The apparatus of claim 17 comprising a gate dielectric, wherein:

the third axis intersects the gate dielectric;

the third spacer is between the gate and the gate dielectric.

* * * * *

UNITED STATES PATENT AND TRADEMARK OFFICE
CERTIFICATE OF CORRECTION

PATENT NO.        : 11,063,137 B2
APPLICATION NO.   : 16/302698
DATED             : July 13, 2021
INVENTOR(S)       : Lin et al.

Page 1 of 1

It is certified that error appears in the above-identified patent and that said Letters Patent is hereby corrected as shown below:

In the Claims

Column 10:
Line 13, "an oxide and a nitride" should be --an oxide or a nitride--;
Line 31, "the gate or the gas" should be --the gate or the gate--.

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*